(12) United States Patent
Wang

(10) Patent No.: US 8,854,887 B2
(45) Date of Patent: Oct. 7, 2014

(54) NONVOLATILE MEMORY DEVICE AND METHOD OF PROGRAMMING THE SAME

(75) Inventor: Jong Hyun Wang, Chungcheongbuk-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 521 days.

(21) Appl. No.: 13/283,760

(22) Filed: Oct. 28, 2011

(65) Prior Publication Data

US 2012/0044761 A1 Feb. 23, 2012

Related U.S. Application Data

(63) Continuation-in-part of application No. 12/361,217, filed on Jan. 28, 2009, now Pat. No. 8,050,097.

(30) Foreign Application Priority Data

Jul. 10, 2008 (KR) .......................... 10-2008-0066873

(51) Int. Cl.
| | |
|---|---|
| *G11C 16/04* | (2006.01) |
| *G11C 11/56* | (2006.01) |
| *G11C 16/10* | (2006.01) |
| *G11C 16/34* | (2006.01) |
| *G11C 16/30* | (2006.01) |

(52) U.S. Cl.
CPC ............ *G11C 16/10* (2013.01); *G11C 11/5628* (2013.01); *G11C 16/3454* (2013.01); *G11C 16/30* (2013.01)
USPC ............. 365/185.18; 365/185.22; 365/185.03

(58) Field of Classification Search
CPC ............... G11C 11/5628; G11C 16/10; G11C 2211/5621; G11C 16/12

USPC .......................... 365/185.18, 185.22, 185.03
See application file for complete search history.

(56) References Cited

U.S. PATENT DOCUMENTS

| | | | |
|---|---|---|---|
| 6,567,315 B2 | 5/2003 | Takase et al. | |
| 7,764,542 B2* | 7/2010 | Edahiro et al. | ............ 365/185.03 |
| 7,983,090 B2* | 7/2011 | Aritome | .................... 365/185.22 |

(Continued)

FOREIGN PATENT DOCUMENTS

| | | |
|---|---|---|
| CN | 1304179 | 7/2001 |
| CN | 1697084 | 11/2005 |

(Continued)

OTHER PUBLICATIONS

Preliminary Rejection issued by the Japanese Patent Office on Apr. 2, 2013.

(Continued)

*Primary Examiner* — Tuan T Nguyen
(74) *Attorney, Agent, or Firm* — IP & T Group LLP

(57) ABSTRACT

A method of 4-bit MLC programming a nonvolatile memory device includes inputting an $m^{th}$ program operation command and sequentially executing first to fourth logical page program operations according to first to fourth logical page program start voltages, each stored in first to fourth logical page program start voltage storage units, wherein a program voltage, which is applied at a time point at which a memory cell programmed higher than a lowest verify voltage while a program operation of each logical page is performed occurs for a first time, is updated to each logical page program start voltage.

17 Claims, 4 Drawing Sheets

(56) References Cited

U.S. PATENT DOCUMENTS

| | | |
|---|---|---|
| 2008/0137416 A1 | 6/2008 | Lee |
| 2008/0253181 A1* | 10/2008 | Edahiro et al. ............ 365/185.03 |
| 2010/0188904 A1* | 7/2010 | Aritome ................... 365/185.22 |
| 2013/0016558 A1* | 1/2013 | Ahn et al. ................. 365/185.03 |

FOREIGN PATENT DOCUMENTS

| | | |
|---|---|---|
| JP | 2000-123584 | 4/2000 |
| JP | 2003-217286 | 7/2003 |
| JP | 2004-094987 | 3/2004 |
| JP | 2007-087513 | 4/2007 |
| JP | 2007-087569 | 4/2007 |
| KR | 1020070094370 | 9/2007 |
| TW | 200529236 | 9/2005 |
| WO | WO 2006/132818 | 12/2006 |

OTHER PUBLICATIONS

Preliminary Rejection issued by the Chinese Patent Office on Dec. 26, 2012.

* cited by examiner

NONVOLATILE MEMORY DEVICE AND METHOD OF PROGRAMMING THE SAME

CROSS-REFERENCE TO RELATED APPLICATION

This application is a continuation in part of U.S. patent application Ser. No. 12/361,217 filed on Jan. 28, 2009 now U.S. Pat. No. 8,050,097, which claims priority to Korean patent application number 10-2008-0066873, filed on Jul. 10, 2008. The disclosure of each of the foregoing applications is incorporated herein by reference in its entirety.

BACKGROUND OF THE INVENTION

The present invention relates to a method of programming nonvolatile memory devices and programming method.

Recently, there has been an increasing demand for nonvolatile memory devices that can be electrically programmed and erased and do not need the refresh function of rewriting data at specific intervals.

The nonvolatile memory cell is an element enabling electrical program/erase operations, and is configured to perform the program and erase operations by changing its threshold voltage as electrons migrate in response to a strong electric field applied to a thin oxide layer of 100 angstrom or less.

The nonvolatile memory device typically includes a memory cell array in which cells for storing data are arranged in matrix form, and a page buffer for writing data into specific cells of the memory cell array or reading data stored in specific cells. The page buffer includes a bit line pair connected to a specific memory cell, a register for temporarily storing data to be written into a memory cell array, or reading data of a specific cell from the memory cell array and temporarily storing the read data therein, a sensing node for sensing the voltage level of a specific bit line or a specific register, and a bit line selection unit for controlling whether or not to connect a specific bit line to the sensing node.

As a method of programming this nonvolatile memory device, an incremental step pulse programming (ISPP) method has been known. That is, a program operation is performed by constantly increasing a program start voltage by a step voltage. However, as the number of program and erase operations increases, the program speed of a memory cell increases. Further, even though a low program start pulse is applied, a change in the threshold voltage of a memory cell increases. If the program start voltage is fixed to a specific value as described above, a change in the threshold voltage becomes great due to the increased program/erase numbers. Consequently, a problem may occur in which threshold voltage distributions are widened.

BRIEF SUMMARY OF THE INVENTION

The present invention is directed towards a method of programming nonvolatile memory devices and programming method, in which a program start voltage can be set variably according to a programmed state without fixing the program start voltage to a specific value.

A nonvolatile memory device according to an aspect of the invention includes a plurality of a memory chips, each configured to include memory blocks including 4-bit or higher multi-level memory cells for storing data and peripheral circuits for programming the memory cells or reading data stored in the memory cells, a program start voltage storage unit configured to store program start voltage information about each of the plurality of memory chips, and a controller configured to repeat a program operation and a program verify operation for a page of the memory chip, selected in response to a program command, from among the pages, until a result of the program verify operation is a path, wherein, in the program operation, the controller supplies a program voltage raised by a step voltage from a program start voltage based on the program start voltage information, stored in the program start voltage storage unit and set based on the selected memory chip, to the selected page and controls the peripheral circuits and the program start voltage storage unit so that information based on a program voltage in a time point at which a memory cell for which the program operation is a pass is first generated, as a result of the program verify operation, is updated into the program start voltage information of the selected memory chip.

A nonvolatile memory device according to another aspect of the invention includes a plurality of memory blocks each configured to include 4-bit or higher multi-level memory cells for storing data, peripheral circuits configured to program the memory cells or read data stored in the memory cells, a program start voltage storage unit configured to store program start voltage information about each of pages of each of the memory blocks, and a controller configured to repeat a program operation and a program verify operation for a page selected in response to a program command, from among the pages, until a result of the program verify operation is a path, wherein, in the program operation, the controller supplies a program voltage, raised by a step voltage from a program start voltage based on the program start voltage information set based on the selected page, to the selected page and controls the peripheral circuits and the program start voltage storage unit so that information based on a program voltage in a time point at which a memory cell for which the program operation is a pass is first generated, as a result of the program verify operation, is updated into the program start voltage information of the selected memory chip.

A 4-bit MLC programming method of a nonvolatile memory device according to still another aspect of the invention includes inputting an $m^{th}$ program operation command and sequentially executing first to fourth logical page program operations according to first to fourth logical page program start voltages, each stored in first to fourth logical page program start voltage storage units, wherein a program voltage, which is applied at a time point at which a memory cell programmed higher than a lowest verify voltage while a program operation of each logical page is performed occurs for a first time, is updated to each logical page program start voltage.

A programming method of a nonvolatile memory device according to still another aspect of the invention includes receiving a program operation command to the nonvolatile memory device including 4-bit multi-level memory cells, sequentially selecting first to fourth logical pages of a first word line, in response to a program operation command, and repeatedly performing a program operation and a program verify operation for the first word line until a result of the program verify operation is a path, wherein, in the program operation, a program voltage raised by a step voltage from a program start voltage based on program start voltage information set according to a selected logical page is supplied to the first word line and information about a program voltage supplied in a time point at which a memory cell for which the program operation is a path is first generated during the program verify operation is updated into the program start voltage information of the selected logical page.

DESCRIPTION OF SPECIFIC EMBODIMENTS

Now, specific embodiments according to the present invention will be described with reference to the accompanying drawings. However, the invention is not limited to the disclosed embodiments, but may be implemented in various ways. The embodiments are provided to complete the disclosure of the invention and to allow those having ordinary skill in the art to understand the scope of the invention. The invention is defined by the category of the claims.

Figure 1:
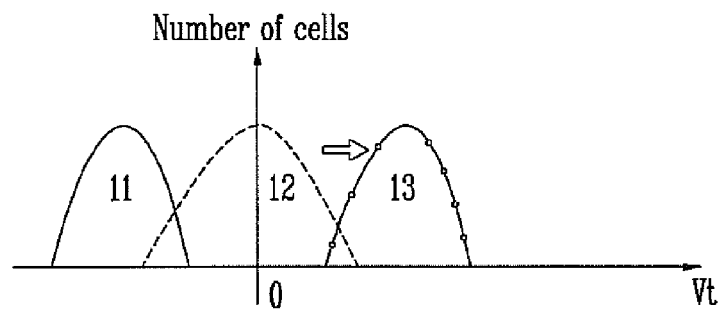
FIG. 1 is a diagram showing a change in threshold voltage distributions when a first pulse is applied upon ISPP of a typical nonvolatile memory device.

FIG. 1 is a diagram showing a change in threshold voltage distributions when a first pulse is applied upon ISPP of a typical nonvolatile memory device.

As shown in FIG. 1, if a first pulse of ISPP is applied to cells 11 being in an erase state, the threshold voltage of the cells rises and, therefore, a threshold voltage distribution 12 shifts to the right. However, in the case in which program/erase operations are repeatedly performed on a nonvolatile memory device, there is a tendency that the program speed becomes fast due to the characteristics of a memory cell. That is, if a first program pulse is applied with the program/erase numbers being increased, the degree of threshold voltage distributions as in a distribution 13 is increased as compared with the distribution 12.

In summary, as the program/erase numbers of a nonvolatile memory device increases, a change in the threshold voltage, which is accompanied by application of a first pulse upon ISPP, is increased. There has been known a method of lowering the voltage level of a first pulse and applying a lowered voltage, when considering a change in the program speed according to an increase in the program/erase numbers as described above.

Figure 2:
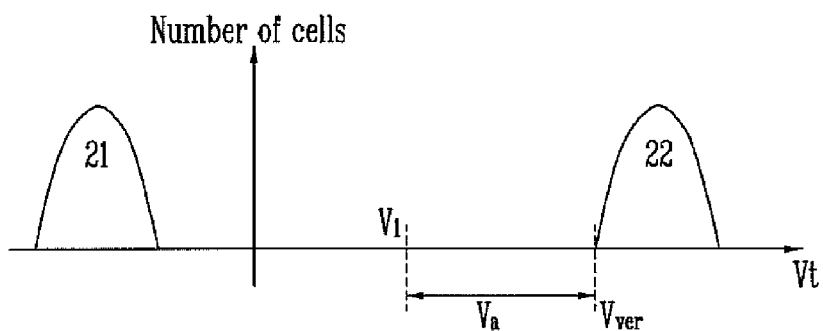
FIG. 2 is a diagram showing a method of setting the voltage level of a first pulse upon ISPP of a nonvolatile memory device.

FIG. 2 is a diagram showing a method of setting the voltage level of a first pulse upon ISPP of a nonvolatile memory device.

In the case in which cells 21 being in an erased state are sought to be programmed to have a verify voltage (Vver) or higher, that is, in the case in which cells being in a programmed state are to be formed, a program start voltage is set considering a change in the threshold voltage when a first program pulse is applied according to an increase in the program/erase numbers.

In other words, the program start voltage is set such that the threshold voltage of a cell, which has the fastest change in the threshold voltage when the first program voltage is applied, becomes a first voltage (V1). A difference Va between the verify voltage Vver and the first voltage (V1) is decided considering a change in the threshold voltage when the first program pulse is applied according to an increase in the program/erase numbers.

For example, assuming that, after one program/erase operation has been performed, the first voltage (V1) when the first program pulse is applied is 0.1V, and, after 1000 program/erase operations have been performed, the first voltage (V1) when the first program pulse is applied is 1.1V, a change in the threshold voltage according to the application of the first program pulse is 1V. Accordingly, a program start voltage is set considering this change such that the first voltage (V1) when the first program pulse is applied becomes 0.1V in the case in which the 1000 program/erase operations are performed.

However, in this case, the program start voltage itself is set low considering the increase in the program/erase numbers and the set program start voltage is fixed. Thus, when the program/erase number is low, the first program pulse functions as a dummy program pulse that does not play a special role. That is, a problem arises because the entire program speed is decreased.

Accordingly, the invention presents a method of variably setting a program start voltage according to a change in the program/erase numbers.

Figure 3:
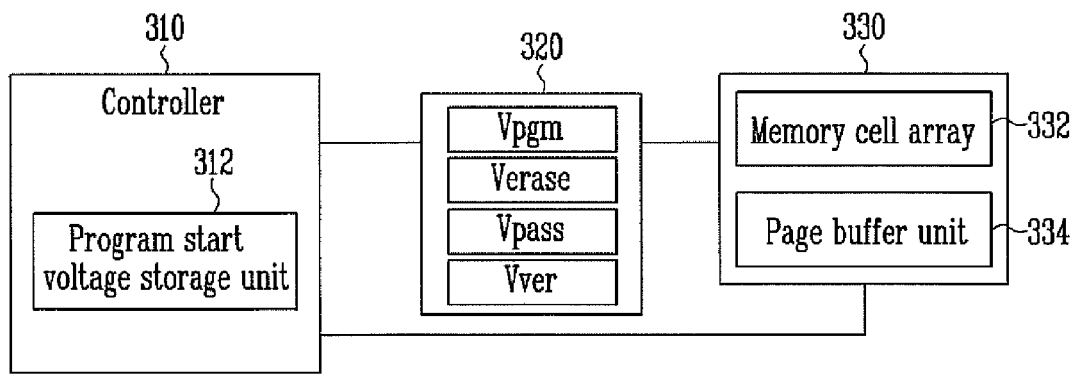
FIG. 3 is a block diagram showing the configuration of a nonvolatile memory device, which is applied to the present invention.

FIG. 3 is a block diagram showing the configuration of a nonvolatile memory device, which is applied to the invention.

A nonvolatile memory device 300 includes a controller 310, a voltage supply unit 320, and a memory cell unit 330.

The controller 310 controls a program operation, an erase operation, a read operation, a verify operation and so on of a nonvolatile memory cell. That is, the controller 310 controls externally input data to be programmed into a memory cell having a desired address according to an externally input control signal and controls data, stored in a memory cell of a specific address, to be read. Further, the controller 310 performs a verify operation for checking whether a program has been completed according to external input data when executing a program operation. In executing the various operations, the controller 310 activates a memory cell of a specific address and controls a voltage suitable for each operation to be applied.

Meanwhile, the controller 310 includes a program start voltage storage unit 312. The program start voltage storage unit 312 stores a level of a program start voltage, which becomes the first pulse of an ISPP operation. To this end, the program start voltage storage unit 312 has a register form. In the invention, a program start voltage is varied according to the program/erase numbers and applied. To this end, program start voltage information is stored in the program start voltage storage unit 312. The program start voltage information is information about a level of a program start voltage which becomes a first pulse in an ISPP program operation. The program start voltage information stored in the program start voltage storage unit 312 is reset whenever a program operation is performed. The reset program start voltage information may be different from information stored before the resetting or may be identical with information stored before the resetting according to an operation.

Meanwhile, the program start voltage storage unit 312 can be configured in various ways according to the form of a memory cell to be updated.

Figure 4:
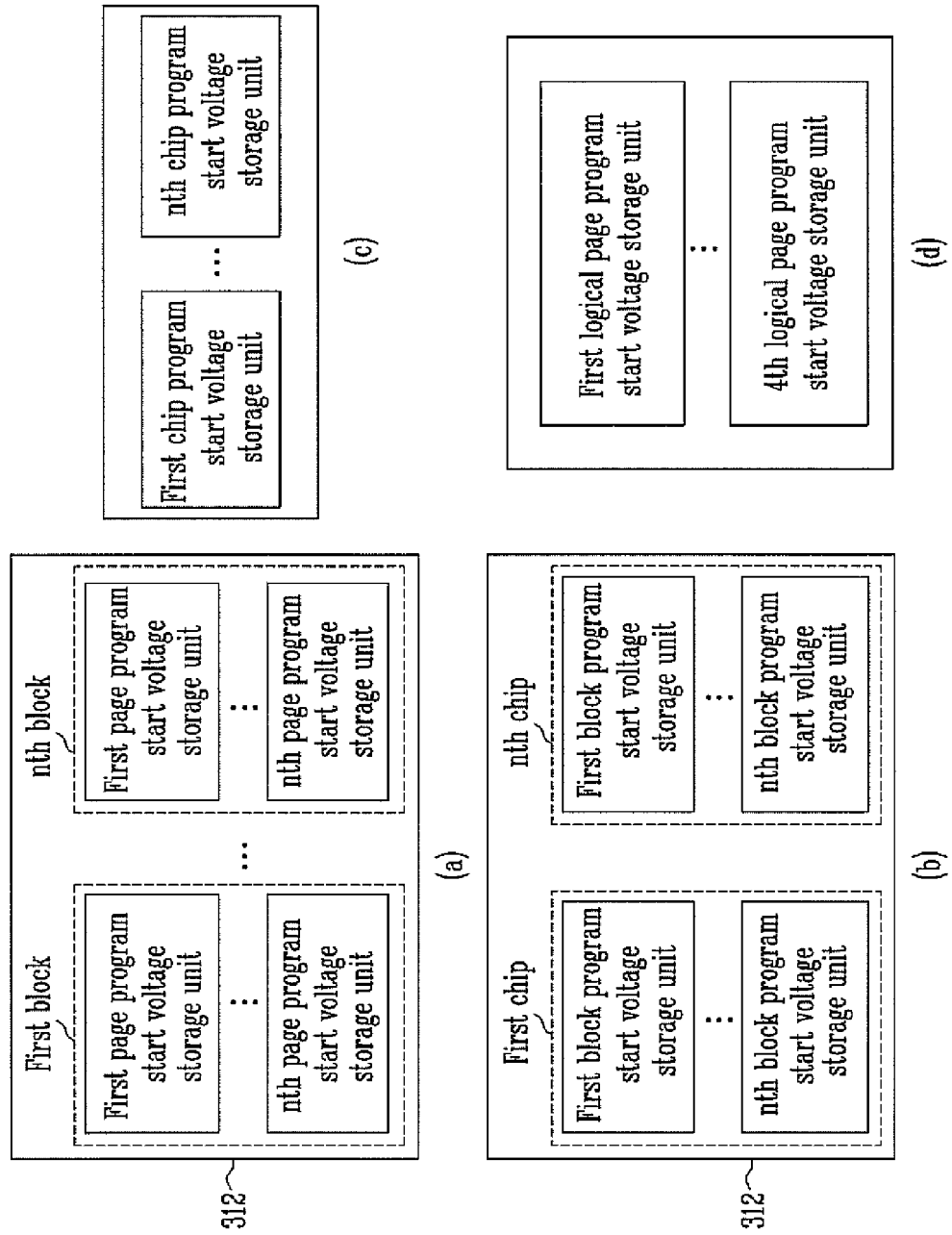
FIG. 4 illustrates various forms of a program start voltage storage unit in accordance with an embodiment of the invention.

FIG. 4 illustrates various forms of the program start voltage storage unit in accordance with an embodiment of the invention.

FIG. 4(A) illustrates an embodiment in which program start voltage information is stored on a page basis.

Thus, the program start voltage storage unit includes first to $n^{th}$ page program start voltage storage units, which are responsible for each memory cell block. Further, different program start voltages information can be applied on a page basis.

Meanwhile, as the program/erase numbers increase, the program start voltage information is updated. A program start voltage information, which is applied at a time point at which any one of target program cells included in a page is programmed higher than a verify voltage, is stored in the program start voltage storage unit. According to the tendency of a nonvolatile cell whose program speed increases as the program/erase numbers increases, the program start voltage information is changed as follows. In other words, in the case in which the program/erase numbers are small in the state where a dummy program pulse is applied, only when a program pulse value is increased to some extent, any one of target program cells can be programmed higher than a verify voltage, and a voltage, which is higher than the verify voltage, can be stored in the program start voltage storage unit. However, in the case in which the program/erase numbers are great, although a program pulse of a low voltage is applied, any one of target program cells can be programmed higher than a verify voltage, and a voltage, which is lower than a voltage already stored in the program start voltage storage unit, can be stored in the program start voltage storage unit.

FIG. 4(B) illustrates an embodiment in which program start voltage information is stored every memory cell block. Thus, the program start voltage storage unit includes first to $n^{th}$ block program start voltage storage units. Further, different program start voltages information can be applied on a block basis. However, the same program start voltage information is applied to different pages included in the same block.

In the present embodiment, the program start voltage information update method shown in FIG. 4(A) is basically used. That is, a program start voltage information, which is applied at a time point at which any one of target program cells is programmed higher than a verify voltage on the basis of a specific page, is stored in the program start voltage storage unit. Here, according to a person who practices the present embodiment, the program start voltage information can be updated on the basis of only a specific page included in one block and can be updated on the basis of a plurality of pages or the entire pages.

The former method can employ a method of updating the program start voltage information on the basis of a specific page and applying this method equally to the entire pages included in a corresponding block. Therefore, the program start voltage information update is generated only at the time of a program operation on a specific page.

In the case of the latter method, program start voltage information of the program start voltage storage unit is updated whenever a program operation is performed on a plurality of selected pages. Therefore, program start voltage information updates are generated as many as the number of pages selected from pages included in a memory cell block. An erase operation is performed on the entire pages included in one memory cell block at the same time. Thus, it can be seen that characteristics according to a change in the program/erase numbers are almost identical across the pages. Accordingly, it can be seen that, although the program start voltage information is updated whenever a program operation is performed on a plurality of selected pages, there is almost no difference in updated program start voltages information as compared with the update method performed on the basis of only one page.

FIG. 4(C) illustrates an embodiment in which program start voltage information is stored on a chip basis.

Thus, the program start voltage storage unit includes first to $n^{th}$ chip program start voltage storage units. Further, different program start voltages information can be applied on a chip basis. However, the same program start voltage information is applied to different blocks included in the same chip. The chip is the unit of memory cells that are driven in response to a different chip enable signal.

Since an erase operation is performed every memory cell block, the program/erase numbers of memory cell blocks included in the same chip may differ. However, in the present embodiment, a wear-leveling method of preventing a phenomenon in which the program operation, the erase operation, etc. are concentrated on a specific block and therefore the program/erase numbers are increased is applied. Accordingly, it can be assumed that characteristics according to a change in the program/erase numbers of the entire blocks included in one chip are almost identical.

A method of updating program start voltage information on the basis of one or more pages included in a chip is used based on this assumption. That is, program start voltage information is measured on the basis of a specific page, and a measured value is identically applied to the entire pages included in the chip.

FIG. 4(D) shows the configuration of a program start voltage storage unit when a 4-bit MLC programming method is used.

In_a 4-bit multi-level cell program, first to fourth logical page programs are performed for a single physical page. Thus, the threshold voltage of a programmed memory cell has one of 16 threshold voltages. In accordance with a 4-bit MLC program, four logical pages are formed. Here, it is necessary to apply different program start voltages information on a logical-page basis. Accordingly, in order to program a 4-bit MLC, the program start voltage storage units for storing four pieces of program start voltage information about the four logical pages are configured. In other words, in order for a 4-bit MLC program to be executed, a first logical page program start voltage storage unit, a second logical page program start voltage storage unit, a third logical page program start voltage storage unit, and a fourth logical page program start voltage storage unit are included.

Meanwhile, a time point at which each program start voltage storage unit is updated is when a program voltage at a time point at which any one cell, which has been programmed higher than the lowest verify voltage, occurs is stored as a new program start voltage information. For example, in the case of a 4-bit MLC program, at the time of a first logical page program, verification is performed on the basis of one verify voltage and, at the time of second to third logical page programs, verification is performed on the basis of two or more verify voltages. At this time, a program voltage at a time point at which any one cell, which has been programmed higher than the lowest verify voltage, occurs is stored as a new program start voltage information for a selected logical page.

Meanwhile, the first to fourth logical page program start voltage storage units are configured to be included in the respective program start voltage storage units shown in FIG. 4(A), (B) or (C). In other words, the respective page program start voltage storage units shown in FIG. 4(A) can be configured to be included in the first to fourth logical page program start voltage storage units, the respective block program start voltage storage units shown in FIG. 4(B) can be configured to be included in the first to fourth logical page program start voltage storage units, or the respective chip program start voltage storage units shown in FIG. 4(C) can be configured to be included in the first to fourth logical page program start voltage storage units.

The remaining constituent elements are described below with reference back to FIG. 3.

The voltage supply unit 320 supplies various voltages to the memory cell unit 330 under the control of the controller 310. In particular, at the time of a program operation, the voltage supply unit 320 applies a program pulse according to program start voltage information stored in the program start voltage storage unit 312.

The memory cell unit 330 includes a memory cell array 332 and a page buffer unit 334. The memory cell array 332 has a plurality of memory cells integrated in matrix form. The page buffer unit 334 temporarily stores external data, which will be stored in each memory cell, and stores data read from memory cells.

A single page buffer (not shown) included in the page buffer unit 334 is coupled to an even bit line BLe and an odd bit line BLo, and the respective bit lines are coupled to one cell string. Memory cells connected to a single word line constitute a page. A program operation is performed on a page basis. Whether or not a program on a corresponding page has been completed can be verified through the page buffer unit 334.

Now, a program method of the invention is described.

Figure 5:
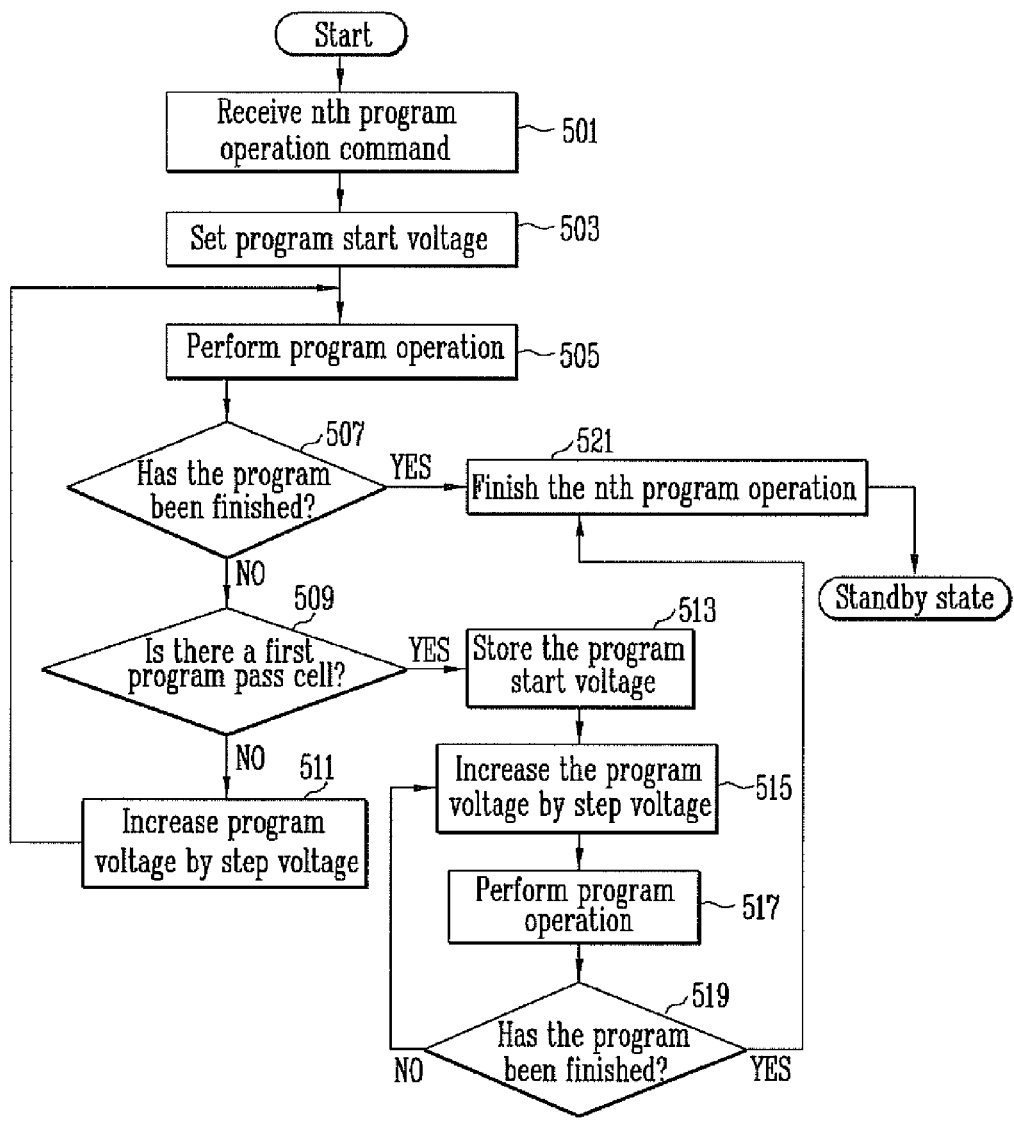
FIG. 5 is a flowchart illustrating a program method of a nonvolatile memory device in accordance with an embodiment of the invention.

FIG. 5 is a flowchart illustrating a program method of a nonvolatile memory device in accordance with an embodiment of the invention. First, an $n^{th}$ program operation command is received in step 501.

In the case of n=1, that is, a program operation command is input for the first time. As the program operation command is input newly, 'n' is increased.

A program start voltage is then set in step 503.

In the invention, a program operation is executed according to the ISPP method and thus a program start voltage and a step voltage have to be set. This step is a step of setting the program start voltage.

To this end, a value stored in the program start voltage storage unit 312 is read and set as the program start voltage information. The program start voltage storage unit 312 may be configured for every word line (or page) as shown in FIG. 4A.

A program operation is then performed according to the set program start voltage in step 505. Here, the program operation is performed on a specific memory cell according to data input to the page buffer by applying a program voltage to a selected word line and a pass voltage to the remaining word lines.

It is then verified whether memory cells, which had been sought to be programmed using the program operation, have all been programmed higher than verify voltages in step 507.

If, as a result of the verification in step 507, the memory cells have all been programmed higher than the verify voltages, an $n^{th}$ program operation is finished in step 521. After step 521, the nonvolatile memory device 100 is in a standby state until a next program command is received. If, as a result of the verification in step 507, all the memory cells have not been programmed, it is determined whether a memory cell for which the program is a pass has first occurred in step 509. A case where the threshold voltages of all selected memory cells have shifted higher than verify voltages is called 'program completion', and a case where each of the threshold voltages of selected memory cells has shifted higher than a verify voltage is called a 'program pass'. In step 509, it is determined whether the threshold voltage of at least one of memory cells coupled to a selected word line has shifted higher than the verify voltages in the above verification in step 507.

If, as a result of the determination in step 509, a specific memory cell has been programmed higher than the verify voltage, the corresponding cell is turned on and a current path of a cell string in which the corresponding cell is included is blocked. Thus, the voltage level of a bit line, which has been precharged to a high level, remains intact and is transferred to the sensing node without change. Since the voltage level of the sensing node is a high level, data stored in the register is changed. When the memory cell whose threshold voltage has shifted is first generated, the program start voltage information is updated.

Program start voltage information at a time point at which the memory cell whose program is a pass is first generated is stored in the program start voltage storage unit 312 in step 513.

Through the step 513, the program start voltage information stored in the program start voltage storage unit 312 just before is updated. If a program is performed for the selected word line again after a memory block including the selected word line is erased, the program start voltage information updated in step 513 is used in step 503 of setting the program start voltage.

If, as a result of the determination in step 509, there is no memory cell for which the program is a pass, the program voltage is raised by a step voltage in step 511 and the steps 505 to 509 are repeatedly performed.

It is then determined whether the program operation for the selected word line has been finished in step 519, and the steps 515 to 519 are repeatedly performed until the program operation for the selected word line is finished. If, as a result of the determination in step 519, the program operation for the selected word line has been finished, the $n^{th}$ program operation is terminated in step 521.

After the program operation, the nonvolatile memory device 100 is in a standby state until a program operation command for a next word line is received. Meanwhile, when the MLC programming method is applied, a program operation similar to the program operation of FIG. 5 is applied for every logical page when a 4-bit MLC is programmed.

Figure 6:
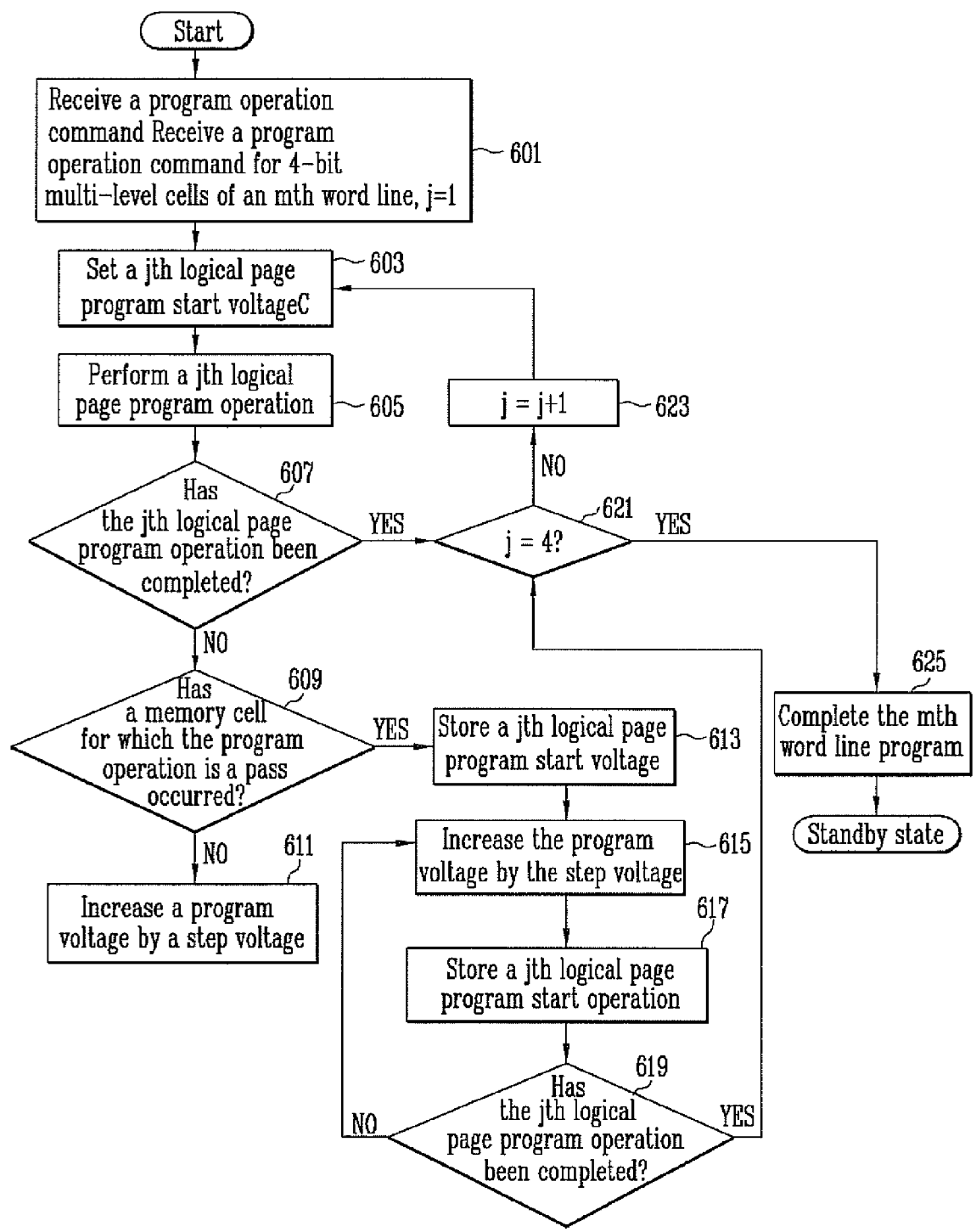
FIG. 6 is a flowchart illustrating a method of programming the nonvolatile memory device including 4-bit MLCs.

FIG. 6 is a flowchart illustrating a method of programming the nonvolatile memory device including 4-bit MLCs according to yet another embodiment of the invention. In the case in which the program method of FIG. 5 is applied to a 4-bit MLC programming method, 4 logical pages program operations are performed on one physical page. Start voltages of the respective logical page programs need not to be set differently. Thus, when a 4-bit MLC program is performed, first to fourth logical page program start voltage storage units are included as in FIG. 4(D).

First, an $m^{th}$ 4-bit MLC program operation command is received in step 601. In the event of m=1, that is, a program operation command is input for the first time. As the program operation command is input newly, 'm' is increased. Meanwhile, 'j=1' is reset, where the value j is a parameter for distinguishing each logical page.

The value j is one of 1, 2, 3, and 4 because the embodiment of the present invention relates to a 4-bit MLC. In the following description of the method of programming the nonvolatile memory device including 4-bit MLCs according to the embodiment of the present invention, it is assumed that a program for the first to fourth logical pages of a third (m=3) word line is performed. First, when a program command for the third word line is received in step 601, a program start voltage for the first logical page of the third word line is set in step 603. As mentioned earlier, in the case of a 4-bit MLC program, 4 logical pages are formed and a program start voltage is set differently on a logical-page basis. Program start voltage information is set sequentially from the first logical page. Here, after a program for a specific logical page is completed, the program is performed on the second-highest logical page. Thus, the program start voltage information is set sequentially from a logical page being responsible for the least significant bit.

To this end, a value stored in the first logical page program start voltage storage unit included in the program start storage unit 312 is read and set as the program start voltage information. If a program start voltage for each of the logical pages of word lines is stored, the program start voltage stored for the first logical page of the third word line is set. In step 605, the program start voltage set for the first logical page is supplied to a selected word line, and a program operation for the first logical page of the selected word line is performed. The program operation is performed on a specific memory cell according to data input to the page buffer by applying a program voltage to a selected word line and a pass voltage to the remaining word lines.

It is then verified whether memory cells, which had been sought to be programmed using the program operation, have all been programmed higher than respective verify voltages in step 607.

In the case of a 4-bit MLC program, the number of verify voltages increases since the number of programmed states increases as the program proceeds from the LSB program to the MSB program. Thus, only when cells set to be programmed in a specific state are all programmed higher than respective verify voltages, a program of a corresponding logical page is completed. One verify voltage is used in a verify operation for the first logical page.

If, as a result of the verification in step 607, all the memory cells have been programmed higher than the respective verify voltages, a program operation for a next logical page is performed. Since the program and verify operation for the first logical page have been performed before, the value j becomes 2 according to steps 621 and 623. A program start voltage for a second logical page is set in step 603, and the steps 605 to 623 are repeatedly performed until the value j becomes 4. Meanwhile, if, as a result of the verification in step 607, the memory cells have not been programmed higher than the respective verify voltages, that is, there is a cell that has not been programmed higher than the verify voltage among target program memory cells, it is determined whether at least one of the memory cell has been programmed higher than the verify voltage in step 609. If, as a result of the determination, a specific cell has been programmed higher than the verify voltage in step 609, the corresponding cell is turned on and a current path of a cell string to which the corresponding cell belongs is blocked. Thus, the voltage level of a bit line, which has been precharged to a high level, remains intact and is transferred to a sensing node without change. Since the voltage level of the sensing node is a high level, data stored in a register is changed. The step 609 is performed to update the program start voltage information. Information about a program voltage in a time point at which a memory cell determined to be a program pass is first generated in step 609 is stored in the program start voltage storage unit in step 613.

If program start voltage information for each of the first to fourth logical pages is stored, the updated program start voltage information is used for a next word line to be programmed. If program start voltage information for not only each of the first to fourth logical pages, but also each of word lines is differently stored, the updated program start voltage information is used in the step of setting a program start voltage for a logical page of a relevant word line, when a program command is receive again after a memory block including the relevant word line is erased. After the program and verify operations for the fourth logical page are completed, the nonvolatile memory device 100 is in a standby state until a next program command is received.

As described above, program start voltage information can be set variably according to the state of each memory cell. That is, at the time of an initial operation in which the program/erase numbers are small, program start voltage information slightly higher than an initially set voltage is applied according to a result of a just-before program operation. At the time of a later operation in which the program/erase numbers are great, a little low program start voltage information is applied since the program speed becomes fast in view of memory cell characteristics.

In accordance with the invention, at the time of a program operation, an ISPP operation can be performed by variably setting program start voltage information in accordance with an increase in the program/erase numbers. Accordingly, when the program/erase numbers are small, a program operation can be performed according to slightly high program start voltage information and, when the program/erase numbers are great, a program operation can be performed according to a slightly low program start voltage information. Thus, although a dummy program pulse is not applied separately, a program operation can be performed by reflecting a change in the program speed according to an increase in the program/erase numbers. Accordingly, there is an advantage in that distributions of the threshold voltage can be maintained constantly.

The embodiments disclosed herein have been proposed to allow a person skilled in the art to easily implement the invention, and the person skilled in the part may implement the invention by a combination of these embodiments. Therefore, the scope of the invention is not limited by or to the embodiments as described above, and should be construed to be defined only by the appended claims and their equivalents.

What is claimed is:

1. A 4-bit MLC programming method of a nonvolatile memory device, the method comprising:
    inputting an $m^{th}$ program operation command; and
    sequentially executing first to fourth logical page program operations according to first to fourth logical page program start voltages, each stored in first to fourth logical page program start voltage storage units,
    wherein a program voltage, which is applied at a time point at which a memory cell programmed higher than a lowest verify voltage while a program operation of each logical page is performed occurs for a first time, is updated to each logical page program start voltage.

2. The 4-bit MLC programming method of claim 1, further comprising, when the $(m+1)^{th}$ program operation command is executed, sequentially executing the first to fourth logical page program operations according to the updated first to fourth logical page program start voltages.

3. The 4-bit MLC programming method of claim 2, wherein the sequential execution of the respective logical page program operations includes repeatedly adding a step voltage to the program start voltage until target program cells are programmed higher than a verify voltage.

4. The 4-bit MLC programming method of claim 1, wherein the updating of the program voltage includes replacing a previously stored logical page program start voltage with a program voltage, which is applied at a time point at which a memory cell programmed higher than a verify voltage occurs for the first time.

5. The 4-bit MLC programming method of claim 1, wherein the first to fourth logical page program start voltage storage units comprise first to fourth page program start voltage storage units for storing different program start voltages on a page basis.

6. The 4-bit MLC programming method of claim 1, wherein the first to fourth logical page program start voltage storage units comprise first to $n^{th}$ block program start voltage storage units for storing different program start voltages on a memory-cell-block basis.

7. The 4-bit MLC programming method of claim 1, wherein the first to fourth logical page program start voltage storage units comprise first to $k^{th}$ chip program start voltage storage units for storing different program start voltages on a chip basis.

8. A nonvolatile memory device, comprising:
a plurality of a memory chips, each configured to include memory blocks including 4-bit or higher multi-level memory cells for storing data and peripheral circuits for programming the memory cells or reading data stored in the memory cells;
a program start voltage storage unit configured to store program start voltage information about each of the plurality of memory chips; and
a controller configured to repeat a program operation and a program verify operation for a page of the memory chip, selected in response to a program command, from among the pages, until a result of the program verify operation is a path, wherein, in the program operation, the controller supplies a program voltage raised by a step voltage from a program start voltage based on the program start voltage information, stored in the program start voltage storage unit and set based on the selected memory chip, to the selected page and controls the peripheral circuits and the program start voltage storage unit so that information based on a program voltage in a time point at which a memory cell for which the program operation is a pass is first generated, as a result of the program verify operation, is updated into the program start voltage information of the selected memory chip.

9. The nonvolatile memory device of claim 8, wherein, if the program start voltage storage unit stores program start voltage information about each of the memory blocks within each of the memory chips, the controller controls the peripheral circuits so that the program operation is performed by using the program start voltage information set according to a memory block including the selected page of the selected memory chip and updates the program start voltage information of the selected memory block within the selected memory chip.

10. The nonvolatile memory device of claim 8, wherein, if the program start voltage storage unit stores program start voltage information about each memory block within each of the memory chips and about each of pages within each memory block, the controller controls the peripheral circuits so that the program operation is performed by using the program start voltage information set according to a selected page of a selected memory block within the selected memory chip and updates the program start voltage information about the selected page of the selected memory block within the selected memory chip.

11. The nonvolatile memory device of claim 10, wherein the program start voltage storage unit stores program start voltage information about each memory block of each of the memory chips and about each logical page of each of the pages within each memory block.

12. A nonvolatile memory device, comprising:
a plurality of memory blocks each configured to include 4-bit or higher multi-level memory cells for storing data;
peripheral circuits configured to program the memory cells or read data stored in the memory cells;
a program start voltage storage unit configured to store program start voltage information about each of pages of each of the memory blocks; and
a controller configured to repeat a program operation and a program verify operation for a page selected in response to a program command, from among the pages, until a result of the program verify operation is a path, wherein, in the program operation, the controller supplies a program voltage, raised by a step voltage from a program start voltage based on the program start voltage information set based on the selected page, to the selected page and controls the peripheral circuits and the program start voltage storage unit so that information based on a program voltage in a time point at which a memory cell for which the program operation is a pass is first generated, as a result of the program verify operation, is updated into the program start voltage information of the selected memory chip.

13. The nonvolatile memory device of claim 12, wherein the program start voltage storage unit stores program start voltage information set for each logical pages of each of word lines of each memory block.

14. A method of programming a nonvolatile memory device, comprising:
receiving a program operation command to the nonvolatile memory device including 4-bit multi-level memory cells;
sequentially selecting first to fourth logical pages of a first word line, in response to a program operation command, and repeatedly performing a program operation and a program verify operation for the first word line until a result of the program verify operation is a path, wherein, in the program operation, a program voltage raised by a step voltage from a program start voltage based on program start voltage information set according to a selected logical page is supplied to the first word line and information about a program voltage supplied in a time point at which a memory cell for which the program operation is a path is first generated during the program verify operation is updated into the program start voltage information of the selected logical page.

15. The method of claim 14, further comprising sequentially selecting first to fourth logical pages of a second word line to be programmed after the first word line, in response to a program command for the second word line, and repeatedly performing a program operation and a program verify operation for the second word line until a result of the program verify operation is a path, wherein a program voltage for each logical page of the second word line is set in the program start voltage information of each of the first to fourth logical pages of the first word line which has been updated in the program operation.

16. The method of claim 14, further comprising:
erasing a memory block including the first word line, if the program start voltage set according to each of the first to fourth logical pages of the first word line is stored for every word line; and
performing the program operation for each of the first to fourth logical pages of the first word line based on the updated program start voltage information, when the program command for the first word line is received again.

17. The method of claim 14, wherein updating the information includes replacing previously stored program start voltage information with information about a program voltage which is supplied in a time point at which a memory cell programmed higher than a verify voltage is first generated.

* * * * *